United States Patent [19]

Hashimoto

[11] Patent Number: 5,709,970

[45] Date of Patent: Jan. 20, 1998

[54] MASK HAVING A PATTERN FOR DETECTING ILLUMINANCE NONUNIFORMITY

[75] Inventor: Shuichi Hashimoto, Tokyo, Japan

[73] Assignee: NEC Corporation, Japan

[21] Appl. No.: 647,705

[22] Filed: May 14, 1996

[30] Foreign Application Priority Data

May 15, 1995 [JP] Japan ................... 7-139893

[51] Int. Cl.$^6$ ............................................. G03F 9/00
[52] U.S. Cl. ................... 430/5; 430/30; 430/22
[58] Field of Search ..................... 430/5, 30, 22; 250/491.1; 356/399, 400, 401

[56] References Cited

U.S. PATENT DOCUMENTS 5,578,401  11/1996  Hwang ...................... 430/5

FOREIGN PATENT DOCUMENTS 58-139427  8/1983  Japan .

*Primary Examiner*—Christopher G. Young
*Attorney, Agent, or Firm*—Hayes, Soloway, Hennessey, Grossman & Hage, P.C.

[57] ABSTRACT

There is provided a mask used in a scan-exposing method of scanning a photosensitive substrate and a mask having a pattern formed therein in relation to a slit-shaped illuminated region, so that the photosensitive substrate is exposed to the pattern having an area larger than that of the slit-shaped illuminated region. The mask has an illuminance nonuniformity detecting pattern formed at an edge region of the mask along a scanning direction, beside a main pattern region of the mask.

5 Claims, 5 Drawing Sheets

MASK HAVING A PATTERN FOR DETECTING ILLUMINANCE NONUNIFORMITY

BACKGROUND OF THE INVENTION

1. Field of the Invention

The present invention relates to a mask having a pattern for detecting illuminance nonuniformity, and more specifically to a mask of this type used in a so called scan-exposing system in which a mask and a photosensitive substrate are scanned in synchronism in relation to an illuminated region for example in the form of a rectangle or an arc, so that the photosensitive substrate is exposed to a pattern having an area larger than that of the illuminated region.

2. Description of Related Art

In a lithographic step of a semiconductor device manufacturing process, there is used a projection exposure machine (projection printer) configured to project a pattern of a mask onto a photosensitive substrate or wafer (precisely, a photoresist deposited on the wafer) by action of an exposing light.

This projection exposure machine includes a flash exposure type for simultaneously projecting a chip pattern of the mask onto a wafer, and a scan-exposure type for scanning a mask and a wafer in synchronism in relation to a slit-shaped illuminated region so that a mask pattern having an area larger than that of the illuminated region is projected onto the wafer.

On the other hand, one performance item of the projection exposure machine is an illuminance nonuniformity. The illuminance nonuniformity can be defined as the degree of nonuniformity in illuminance within an exposed field. If the illuminance nonuniformity is high, a line width variation occurs in the exposed field. Therefore, it is necessary to make the illuminance nonuniformity not greater than a certain degree.

In the prior art, flash exposure type had been dominant, but recently, since a demand for a field enlargement to make it possible to project a large chip pattern onto a wafer is increasing, attention has been focused onto the scan-exposure type. In the scan-exposure type, however, since the mask and the wafer are moved in synchronism in relation to an exposing light, if there occur a timing deviation in the synchronizing and/or a variation or fluctuation in the scanning speed, these directly result in illuminance nonuniformity. In addition, if a pulse-excited laser is used as a light source, if light intensity of the laser varies in the course of the scan-exposing (for example, due to misfire), this also results in illuminance nonuniformity. Therefore, the scan-exposure type needs an illuminance nonuniformity control stricter than that required in the flash exposure type.

In the prior art, the illuminance nonuniformity in the projection exposure has been determined by measuring illuminance over the whole surface of a wafer stage while displacing an illuminance sensor on the wafer stage by steps of about 1 mm, and by performing calculation based on the result of the measurement.

Alternatively, Japanese Patent Laid-open Publication No. JP-A-58-139427 and English Abstract thereof (the disclosure of which is incorporated by reference in its entirety into this application) discloses another method, in which, as shown in FIG. 1, a wafer is actually exposed through an illuminance nonuniformity detecting mask 9 having an illuminance nonuniformity detecting pattern 10 of a "limit of resolution" formed over the whole of the mask 9, and an exposed and developed wafer is observed in order to investigate the illuminance nonuniformity.

This method is very effective in detecting the illuminance nonuniformity of the scan exposing machine in a steady condition. However, this method cannot detect the illuminance nonuniformity which accidentally occurs in the course of the exposure of an actual product pattern because of the above mentioned various causes.

SUMMARY OF THE INVENTION

Accordingly, it is an object of the present invention to provide a mask which has overcome the above mentioned defect of the conventional one.

Another object of the present invention is to provide a mask having an illuminance nonuniformity detecting pattern and capable of detecting the illuminance nonuniformity which accidentally occurs in the course of the exposure of an actual product pattern.

The above and other objects of the present invention are achieved in accordance with the present invention by a mask used in a method for exposing a photosensitive substrate to a mask pattern having an area larger than that of an illuminated region, by scanning the mask and the photosensitive substrate in relation to the illuminated region, the mask having an illuminance nonuniformity detecting pattern formed at an edge region of the mask along a scanning direction, beside a main pattern region of the mask.

Here, the term "photosensitive substrate" should be construed to be a substrate or wafer on which a photosensitive layer such as a photoresist layer is deposited.

The above mentioned mask can be effectively used in a scan-exposing method of scanning a photosensitive substrate and a mask having a pattern formed therein in relation to a slit-shaped illuminated region, so that the photosensitive substrate is exposed to the pattern having an area larger than that of the slit-shaped illuminated region.

For example, the illuminance nonuniformity detecting pattern can be formed of a line-and-space pattern having a plurality of lines and spaces extending over a full scanning direction length of the mask, the line and spaces having a width close to the "limit of resolution", a contact hole pattern having a number of contact holes having a size close to the "limit of resolution" and extending over a full scanning direction length of the mask, or a rhombic aperture pattern having a number of rhombic apertures distributed over a full scanning direction length of the mask.

In the mask in accordance with the present invention, since the illuminance nonuniformity detecting pattern is formed at the edge region of the mask along the scanning direction, for example, at an upper edge region or a lower edge region, the illuminance nonuniformity detecting pattern never interfere with the main pattern region of the mask, but if the illuminance nonuniformity detecting pattern is formed at the edge region of a mask for an actual product, it is possible to detect the illuminance nonuniformity which accidentally occurs in the course of the exposure of an actual product mask pattern. According, it is possible to carry out a strict control of the illuminance nonuniformity, and therefore, to decrease a fraction defective of actual products.

The above and other objects, features and advantages of the present invention will be apparent from the following description of preferred embodiments of the invention with reference to the accompanying drawings.

DESCRIPTION OF THE PREFERRED EMBODIMENTS

Figure 1:
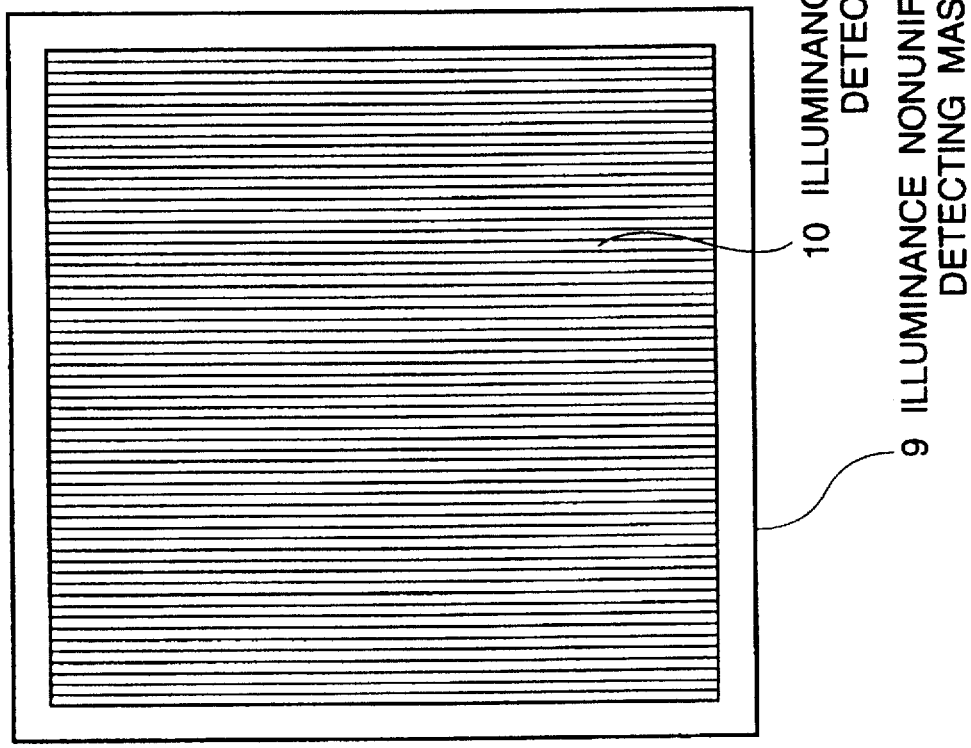
FIG. 1 diagrammatically illustrates an example of a prior art mask having an illuminance nonuniformity detecting pattern.
Figure 2A:
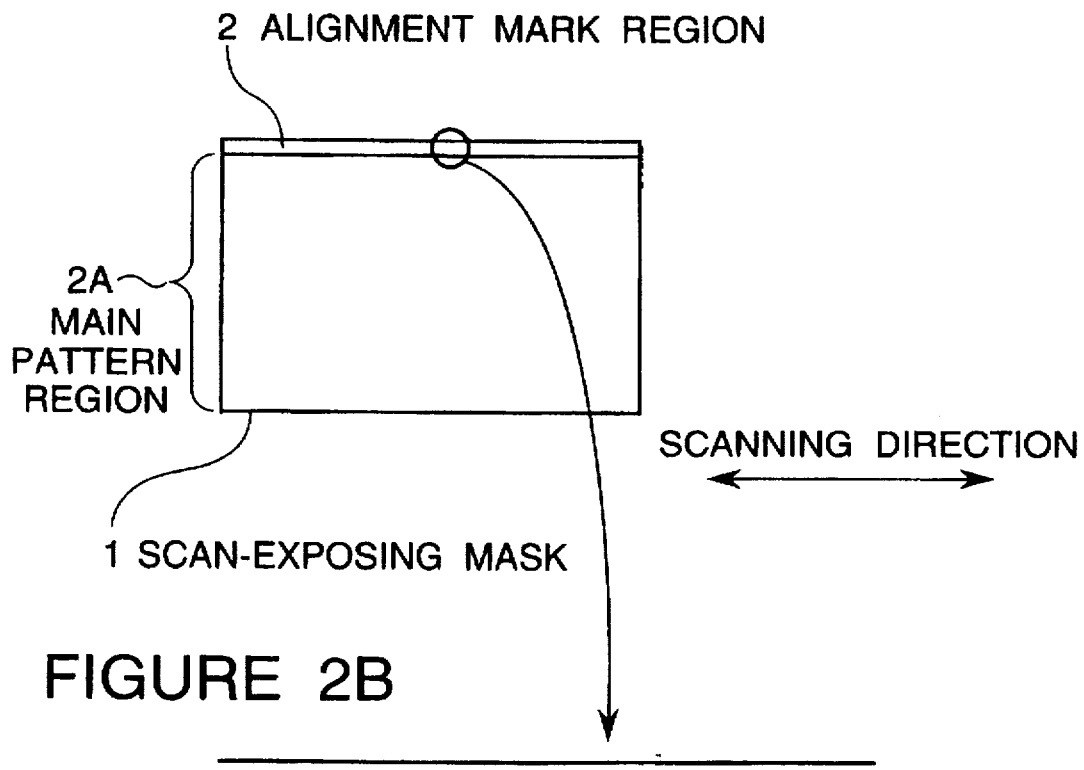
FIG. 2A is a diagrammatic plan view of one embodiment of an exposure mask in accordance with the present invention.

Referring to FIG. 2A, there is shown a diagrammatic plan view of one embodiment of an exposure mask in accordance with the present invention. The following dimension example is a size on a wafer, and therefore, if a reduction ratio of a reducing projection exposure machine is 1/x, the size on a mask is "x" times the size on the wafer.

In the embodiment of the scan-exposing mask designated by Reference Numeral 1 in FIG. 2A, a size of the mask is 32.5 mm×22 mm. This mask includes a main pattern region 2A and an alignment mark region 2 having a width of 1000 μm (=1 mm) formed at an upper edge of the mask 1 along a full length of a scanning direction.

Figure 2B:
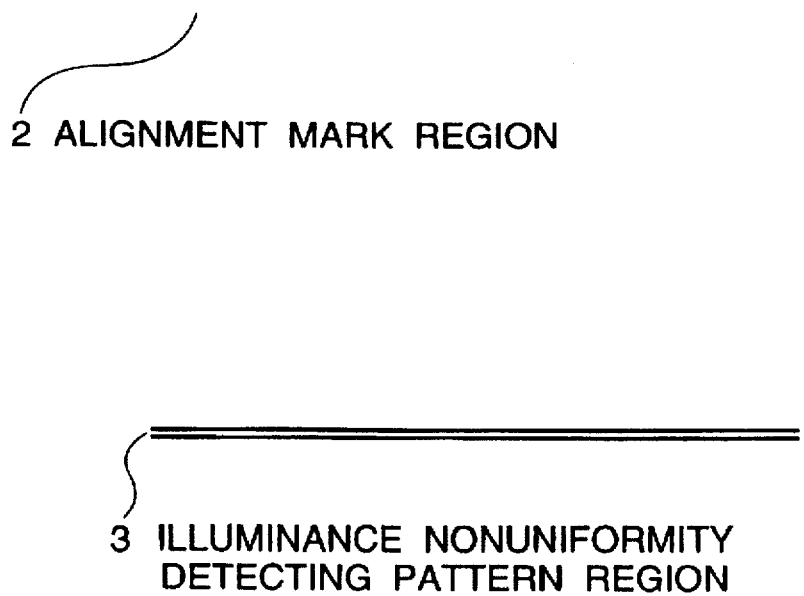
FIG. 2B is an enlarged diagrammatic view of an alignment mark region of the exposure mask shown in FIG. 2A.

Referring to FIG. 2B, there is shown an enlarged diagrammatic view of the alignment mark region 2 of the exposure mask shown in FIG. 2A. Along the alignment mark region 2, and between the alignment mark region 2 and the main pattern region 2A of the mask 1, an illuminance nonuniformity detecting pattern region 3 having a width of 10 μm is formed. This illuminance nonuniformity detecting pattern region 3 extends over the full length of the mask 1 in the scanning direction.

As mentioned hereinbefore, since an accidental illuminance nonuniformity is apt to occur in the scanning direction in the scan-exposing type exposure machine, it is sufficient if the illuminance nonuniformity detecting pattern region 3 is formed to extend only in the scanning direction. In addition, if the illuminance nonuniformity detecting pattern region 3 has the width of 10 μm, an area of the illuminance nonuniformity detecting pattern region 3 is about 0.045% of the whole area of the mask. Therefore, it could be understood that the illuminance nonuniformity detecting pattern region 3 occupies only an extremely small area in order to attain an expected effect. Furthermore, since the illuminance nonuniformity detecting pattern region 3 is provided at the edge of the mask, the illuminance nonuniformity detecting pattern region 3 never interfere with the main pattern region 2A, and therefore, can be formed in a mask for an actual product.

In the above embodiment, it has been described that the illuminance nonuniformity detecting pattern region 3 has the width of 10 μm. However, the width of the illuminance nonuniformity detecting pattern region 3 is in no way limited only to 10 μm, and can be made to a value smaller than 10 μm if a necessary illuminance nonuniformity detecting pattern can be formed within the illuminance nonuniformity detecting pattern region 3. In addition, in the above embodiment, the illuminance nonuniformity detecting pattern region 3 is formed adjacent to the alignment mark region 2, but can be positioned at an arbitrary location which does not interfere with the main pattern region 2A and which extends in the scanning direction. For example, the illuminance nonuniformity detecting pattern region 3 can be formed at a lower edge of the mask 1 along the full length of the scanning direction.

Now, examples of an illuminance nonuniformity detecting pattern and a method for detecting an illuminance nonuniformity by using the illuminance nonuniformity detecting pattern example, will be described.

Figure 3:
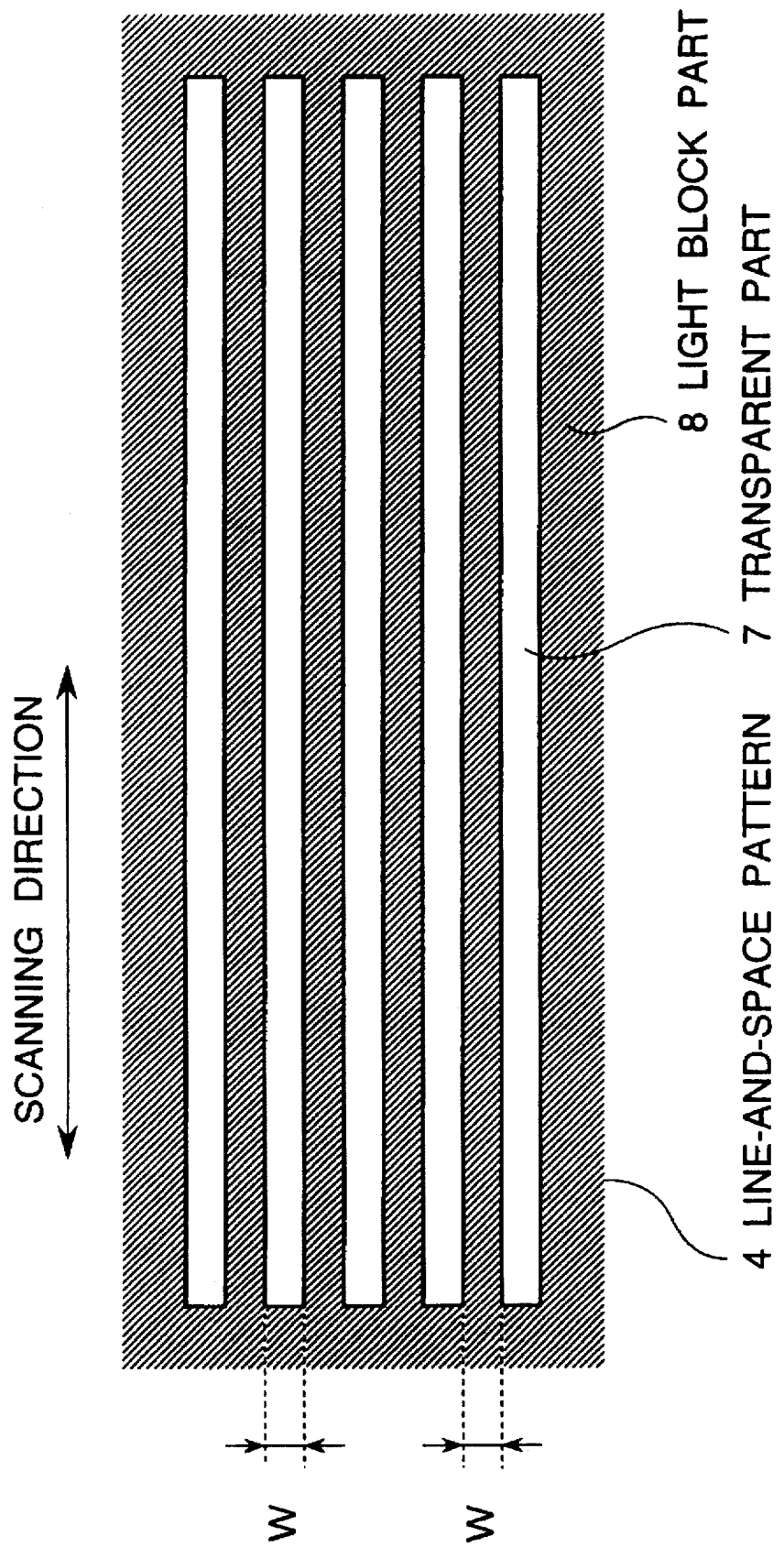
FIG. 3 is diagrammatically illustrates a first example of an illuminance nonuniformity detecting pattern formed in the exposure mask in accordance with the present invention.

Referring to FIG. 3, a first example of an illuminance nonuniformity detecting pattern formed in the illuminance nonuniformity detecting pattern region 3 of the exposure mask 1 in accordance with the present invention is diagrammatically illustrated. This first example shows a line-and-space pattern 4, which has a number of transparent parts 7 extending in the scan direction, in parallel to each other and separated from each other by a light block part 8 having the same width as that of the transparent part 7.

In the example shown in FIG. 3, the line-and-space pattern 4 has lines and spaces having equal widths W of 0.25 μm. This width is so selected to be larger than but close to the "limit of resolution" of the exposure machine. In addition, the lines and spaces of the example shown in FIG. 3 have only a single width, but can be modified to have a few kinds of different widths including a width larger than but close to the "limit of resolution".

For detecting the illuminance nonuniformity by using the example shown in FIG. 3, since the illuminance nonuniformity detecting pattern is formed in a mask for an actual product, an exposed and developed line-and-space photoresist pattern is observed by using a scanning electron microscope (SEM), so as to measure the dimensions (namely, width) of the line-and-space photoresist pattern by constant intervals, and to check whether or not a variation of the dimensions is within a predetermined tolerance range. If the variation of the dimensions exceeds the predetermined tolerance range, it can be deemed that the illuminance nonuniformity is not acceptable. Alternatively, an exposed and developed line-and-space resist pattern is observed by a microscope so as to know whether or not a resist pattern of a line having a width near to the "limit of resolution" of the exposure machine is clearly developed or formed.

Figure 4:
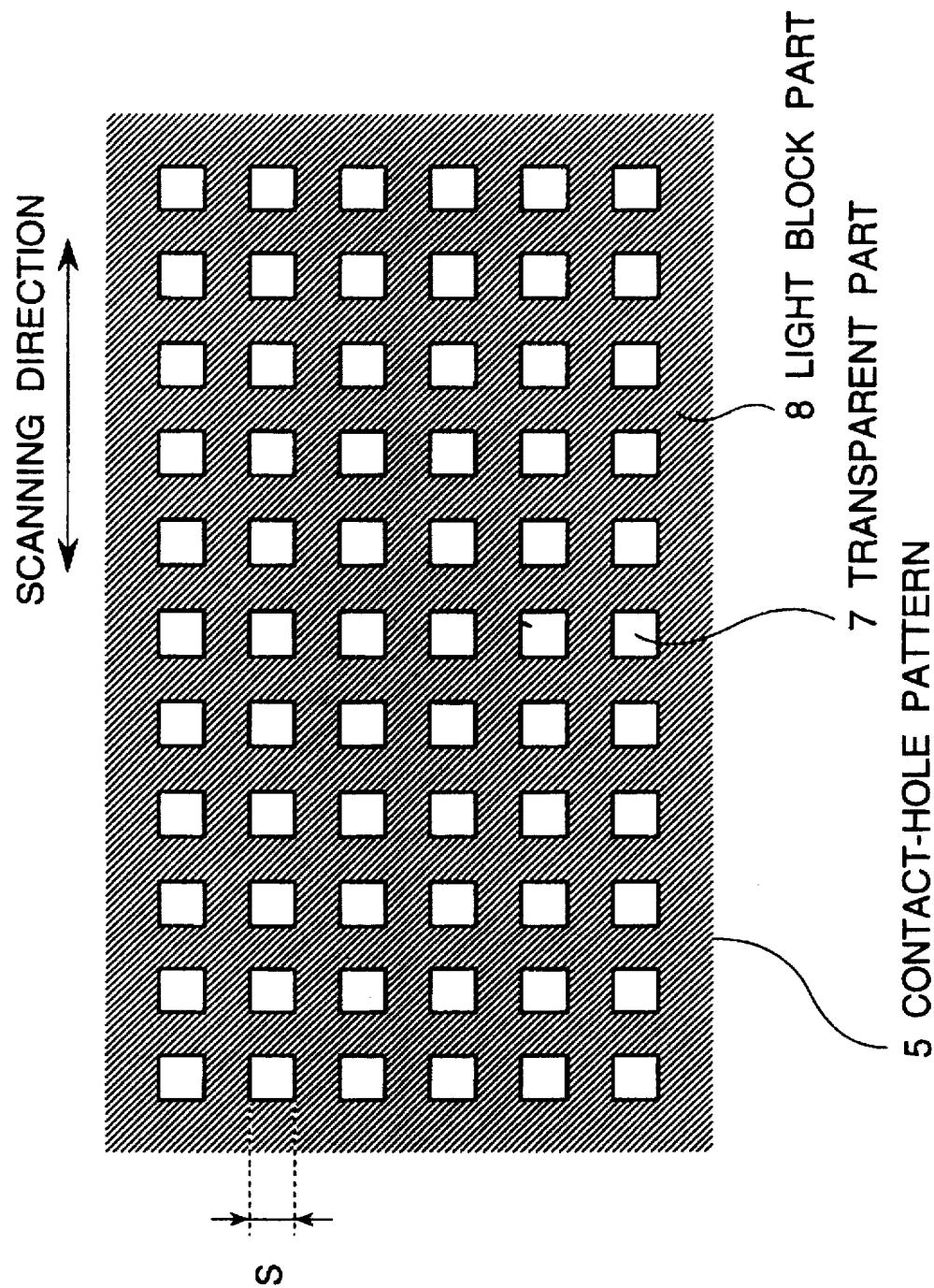
FIG. 4 is diagrammatically illustrates a second example of an illuminance nonuniformity detecting pattern formed in the exposure mask in accordance with the present invention.

FIG. 4 diagrammatically illustrates a second example of an illuminance nonuniformity detecting pattern formed in the exposure mask in accordance with the present invention. This second example shows a contact-hole pattern 5, which has a number of contact holes (transparent part 7) each having a size larger than but close to the "limit of resolution". In the shown example, each contact hole has a size S of 0.3μm□, and the contact holes are regularly arranged with constant intervals to form a matrix having a plurality of rows and a plurality of columns. A spacing between each pair of adjacent contact holes in a row direction and in a column direction may be or may not be the same size as that of the contact hole (0.3 μm).

In this example shown in FIG. 4, the size of the contact holes is so selected to be larger than but close to the "limit of resolution" of the exposure machine, similarly to the example shown in FIG. 3. However, it is possible to use contact holes having a few different sizes including a size larger than but close to the "limit of resolution".

A resist pattern obtained by using a mask of a contact hole having the size close to the "limit of resolution" of the exposure machine, is very sensitive to variation of an exposure amount. With a slight variation of the exposure amount, an aperture is formed or not formed in the resist pattern. Accordingly, the illuminance nonuniformity can be easily detected by observing the developed resist pattern by a microscope.

Figure 5:
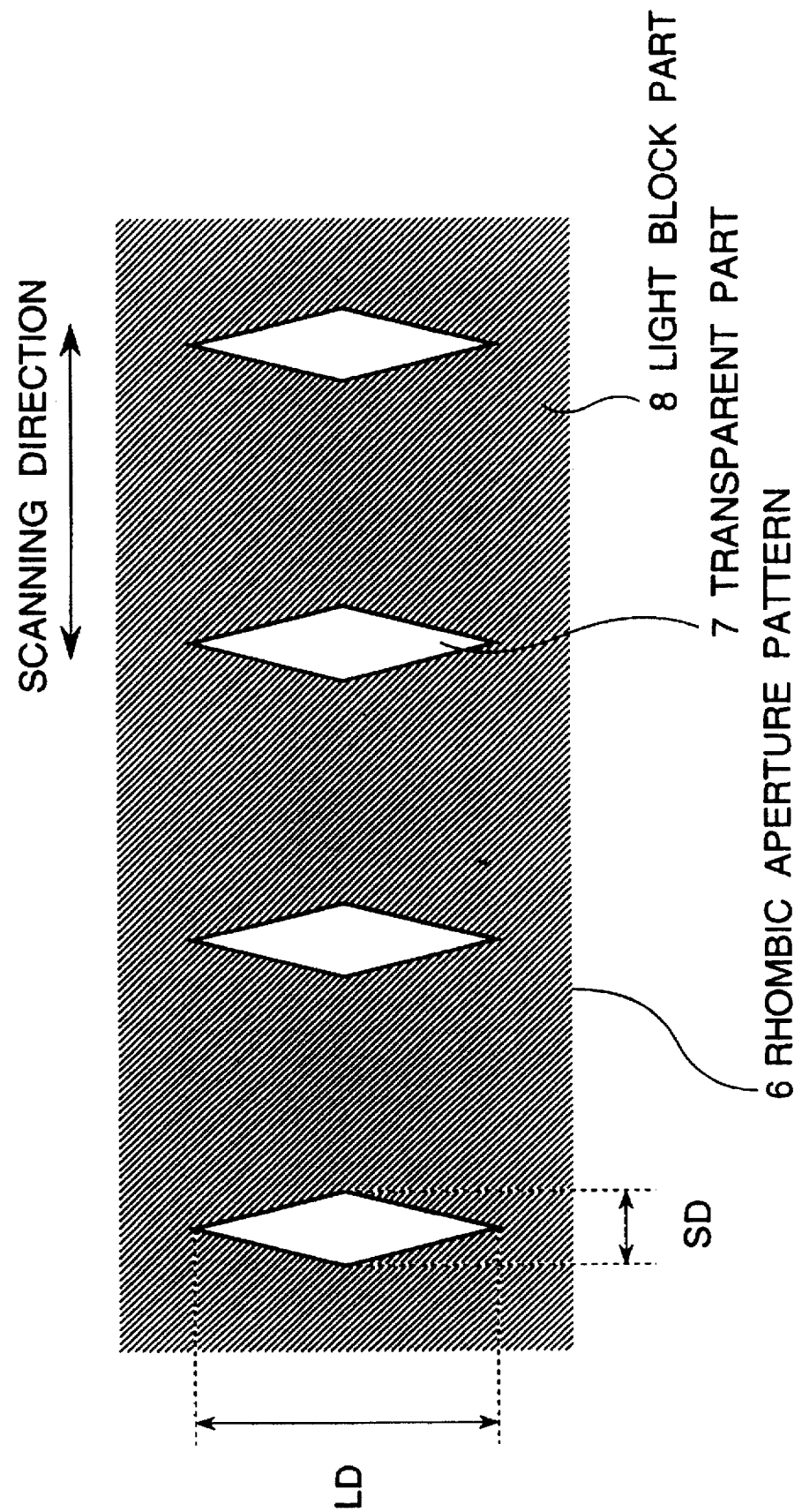
FIG. 5 is diagrammatically illustrates a third example of an illuminance nonuniformity detecting pattern formed in the exposure mask in accordance with the present invention.

FIG. 5 diagrammatically illustrates a third example of an illuminance nonuniformity detecting pattern formed in the exposure mask in accordance with the present invention. This third example shows a rhombic-aperture pattern 6, which has a number of rhombic apertures (transparent part 7) regularly arranged along a single line in the scanning direction. In the shown rhombic apertures 7, a long diagonal line LD is 2 μm, and a short diagonal line SD is 0.5μm. For example, the rhombic apertures 7 are so directed to have its long diagonal line perpendicular to the scanning direction, as shown in FIG. 5.

In the example shown in FIG. 5, the length of the short diagonal line is so selected to be sufficiently larger than the "limit of resolution" of the exposure machine, so that a width of a pair of wedge-shaped parts of each rhombic aperture gradually reduces from the value sufficiently larger than the "limit of resolution" toward a tip end of the wedge shaped part. Therefore, the exposure mount gradually reduces from a base portion of the wedge (namely, a central portion of the rhombic aperture) to the tip end of the wedge. Accordingly, if the illuminance varies, a length of the rhombic aperture (in a direction perpendicular to the scanning direction) in which an optimum exposure mount can be obtained, changes. Thus, the illuminance nonuniformity can be easily detected by observing the length of each rhombic aperture in the developed resist pattern by a microscope or SEM.

The rhombic aperture is considered to be a combination of pair of wedge-shaped apertures or isosceles triangle aperture. Therefore, each rhombic aperture can be modified to a single isosceles triangle aperture having a base extending in parallel to the scanning direction or perpendicular to the scanning direction.

As seen from the above, according to the present invention it is possible to detect the illuminance nonuniformity which accidentally occurs in the course of the exposure of an actual product pattern, because of a deviation in synchronism between the mask and the wafer, a variation or fluctuation in the scanning speed, or a variation in light intensity of a pulse-excited laser. On the other hand, since the illuminance nonuniformity detecting pattern region is provided at an edge region of the mask along the scanning direction, and occupies only a slight area, the present invention can be effectively applied to a mask for an actual product. As a result, if the present invention is actually applied to a mask for an actual product, it is possible to find out the illuminance nonuniformity immediately after the exposure step (photoresist patterning step). Therefore, if the illuminance nonuniformity is found out, the resist is removed, and then, a photoresist is deposited again, and exposure is carried out. This can effectively reduce the fraction defective of products.

The shape, the size, the number and the location of the transparent parts (such as apertures or holes) 7 in the illuminance nonuniformity detecting pattern can be freely selected, if an projected image portion having a size or width close to the "limit of resolution" appears over the full scanning direction length of the mask continuously or repeatedly with constant intervals close to the "limit of resolution".

The invention has thus been shown and described with reference to the specific embodiments. However, it should be noted that the present invention is in no way limited to the details of the illustrated structures but changes and modifications may be made within the scope of the appended claims.

I claim:

1. A mask used in a method for exposing a photosensitive substrate to a mask pattern having an area larger than that of an illuminated region, by scanning the mask and the photosensitive substrate in relation to the illuminated region, the mask having an illuminance nonuniformity detecting pattern formed at an edge region of the mask along a scanning direction, beside a main pattern region of the mask.

2. A mask claimed in claim 1 wherein the mask is a mask which is used in a scan-exposing method of scanning a photosensitive substrate and a mask having a pattern formed therein in relation to a slit-shaped illuminated region, so that the photosensitive substrate is exposed to the pattern having an area larger than that of the slit-shaped illuminated region.

3. A mask claimed in claim 1 wherein said illuminance nonuniformity detecting pattern is formed of a line-and-space pattern having a plurality of lines and spaces extending over a full scanning direction length of the mask, said line and spaces having a width close to the limit of resolution.

4. A mask claimed in claim 1 wherein said illuminance nonuniformity detecting pattern is formed of a contact hole pattern having a number of contact holes having a size close to the limit of resolution and extending over a full scanning direction length of the mask.

5. A mask claimed in claim 1 wherein said illuminance nonuniformity detecting pattern is formed of a rhombic aperture pattern having a number of rhombic apertures distributed over a full scanning direction length of the mask.

* * * * *